(12) United States Patent
Correale, Jr. et al.

(10) Patent No.: US 6,657,912 B1
(45) Date of Patent: Dec. 2, 2003

(54) CIRCUIT FOR OPTIMIZING POWER CONSUMPTION AND PERFORMANCE

(75) Inventors: Anthony Correale, Jr., Raleigh, NC (US); Nishith Rohatgi, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/393,286

(22) Filed: Mar. 20, 2003

(51) Int. Cl.$^7$ .................................................. G11C 7/00
(52) U.S. Cl. .................................. 365/227; 365/189.04
(58) Field of Search ............................. 365/189.04, 227

(56) References Cited

U.S. PATENT DOCUMENTS

| | | | |
|---|---|---|---|
| 4,779,013 A | 10/1988 | Tanaka ........................ 307/451 |
| 6,087,855 A | 7/2000 | Frederick, Jr. et al. ..... 326/106 |
| 6,160,749 A | 12/2000 | Pinkham et al. ............. 365/226 |
| 6,208,575 B1 * | 3/2001 | Proebsting ................... 365/207 |
| 6,269,035 B1 | 7/2001 | Cowles et al. .............. 365/200 |
| 6,462,998 B1 * | 10/2002 | Proebsting .................. 365/205 |

* cited by examiner

*Primary Examiner*—M. Tran
(74) *Attorney, Agent, or Firm*—Scott W. Reid; Sawyer Law Group, L.L.P.

(57) ABSTRACT

A memory bit line multiplexor circuit is disclosed. The circuit comprises at least one memory cell arrangement. The circuit includes a first active device coupled to the at least one memory cell arrangement and for coupling a first node to a second node within the circuit. The first active device is controlled by a write through read (!wtr) signal. The circuit includes a second active device coupled to the second node and a gate. The gate has a first input coupled to the first node; a second input coupled to the !WTR signal, and a third input being controlled by an inversion of the output of the circuit. The gate and the second active device provide a pulsed self-timed response that minimizes power consumption while optimizing performance of the circuit. A circuit in accordance with the present invention is disclosed in which the most power, and area efficient realizations can be employed for applications requiring broad power supply operating ranges. The circuit employs a simple logic gate system configured to create a self-timed pulsed stimulus for allowing improved performance over a very broad Vdd operation range while simultaneously reducing power.

14 Claims, 7 Drawing Sheets

Table 1

| Configuration | Vdd | Tplh | Pwr L-H |
|---|---|---|---|
| Nfet only | 0.7 | 7.1 | 1 |
| N/P pair | | 1 | 1 |
| This disclosure | | 0.65 | 0.97 |
| | | | |
| Nfet only | 1.1 | 1.03 | 0.9 |
| N/P pair | | 1 | 1 |
| This disclosure | | 0.92 | 0.89 |
| | | | |
| Nfet only | 1.4 | 1 | 0.84 |
| N/P pair | | 1 | 1 |
| This disclosure | | 0.97 | 0.78 |
| | | | |

CIRCUIT FOR OPTIMIZING POWER CONSUMPTION AND PERFORMANCE

FIELD OF THE INVENTION

The present invention relates to driver circuits, and more particularly to a circuit for optimizing power consumption and performance of driver circuits.

BACKGROUND OF THE INVENTION

Low power requirements in a circuit often conflict with high performance requirements. As a result, the voltage ranges at which circuits can operate can be limited in order to address this conflict. For example, circuit configurations that are efficient with regard to power, performance, and area are limited in that they can operate at one voltage but often cannot operate properly at other voltages, e.g., lower voltages. Conversely, circuit configurations that are designed for broad voltage operations often do not exhibit optimal power, performance, and area characteristics.

A classic example of the trade off between low power requirements and high performance requirements is that of a register file. A register file often includes an array of memory elements. All memory elements within a bit slice are connected to one another through a multiplexor. Each memory element within a bit slice could include, for example, one or more pass gates, each associated with a different word line. Incorporating the pass gates in each memory element and then coupling the pass gate outputs together within the bit slice effectively distribute the multiplexor.

Figure 1:
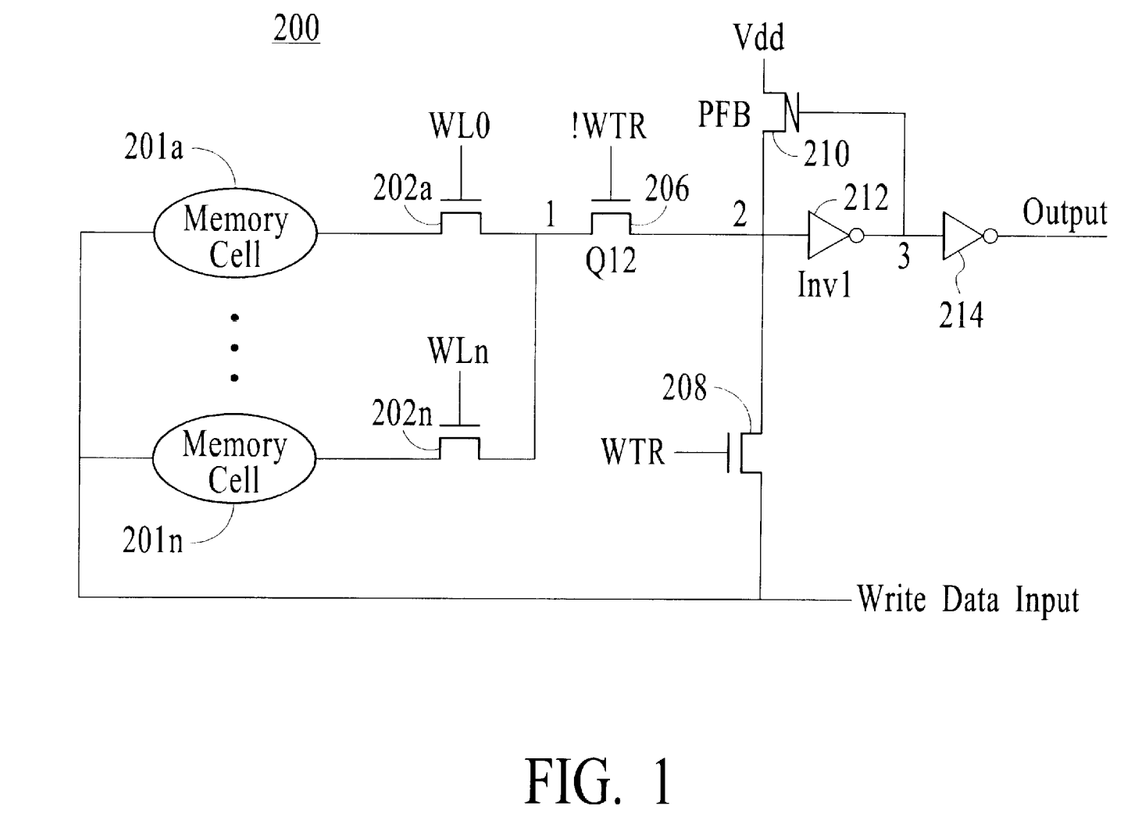
FIG. 1 is a diagram of a first conventional multiplexed memory bit-line circuit.

FIG. 1 is a diagram of a first conventional multiplexed memory bit-line circuit. As is seen, a plurality of memory cells 201 are coupled to respective nfet devices 202a–202n. The nfet device 206 which is controlled by a write through read (!WTR) signal, is active during a normal read operation and node-2 will follow node-1, but it is delayed in time and will not achieve the same voltage uplevel. The inverter 212 whose output is connected to node-3, has a very high nfet to pfet ratio to cause a better response to the weak/poor rising response on node-2. As node-3 falls, it activates the pfet feedback device 210, which causes node-2 to rise to Vdd eliminating any leakage current in inverter 212 associated with the weak "1" input.

As Vdd is reduced, the response of node-2 is greatly degraded as the nfet device 206 connecting node-1 and node-2, is on very weakly. In fact, as the Vdd is lowered further, node-2 cannot achieve a voltage high enough to switch the inverter 212. This is clearly a failure. One approach to resolving this failure is to apply the same boot-strap technique to the !WTR controlled device as is applied to the wordlines. This can and will work, but will raise the power associated with both the increased current demand on the voltage "doubler" and the power that will result on the bit lines being allowed to charge to a higher potential as the feedback device 210 raises node-3 and 'reverse' loads the bit lines.

Figure 2:
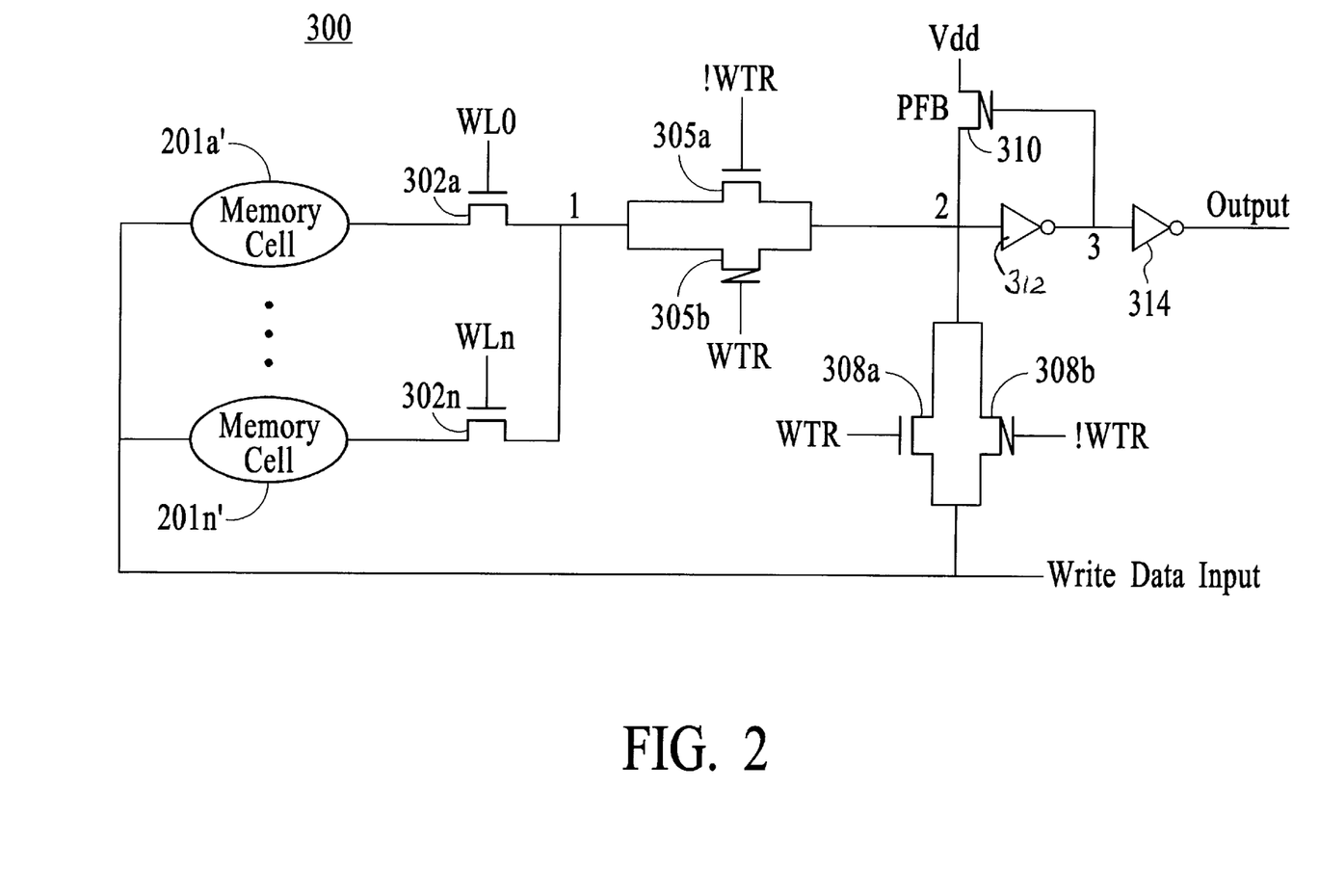
FIG. 2 illustrates a second conventional multiplexed memory bit-line.

FIG. 2 illustrates a second conventional multiplexed memory bit-line. In this circuit 300, the pass transistor connecting node-1 and node-2 is replaced by a transmission gate, T1, (nfet device 305a controlled by !WTR and pfet device 305b controlled by WTR) to improve performance and expand the Vdd operating range.

With the transmission gate configuration, node-2 will now follow node-1, albeit rather slowly, and result in node-2 having the identical voltages as node-1. The transient response of node-2 will naturally be slow as the pfet device 305b portion of the transmission gate, while active, is on rather weakly. A major drawback of this configuration is the fact the once the inverter 312, switches low, the output of the pfet feedback device 310 will now charge both node-2 and node-1. Since node-1 is the bitline that is highly capacitive, this will result in a slower falling response, but more importantly significantly higher power.

Accordingly, what is needed is a means to minimize power consumption while not compromising performance. The present invention addresses such a need.

SUMMARY OF THE INVENTION

A memory bit line multiplexor circuit is disclosed. The circuit comprises at least one memory cell arrangement. The circuit includes a first active device coupled to the at least one memory cell arrangement and for coupling a first node to a second node within the circuit. The first active device is controlled by a write through read (!wtr) signal. The circuit includes a second active device coupled to the second node and a gate. The gate has a first input coupled to the first node; a second input coupled to the !WTR signal, and a third input being controlled by an inversion of the output of the circuit. The gate and the second active device provide a pulsed self-timed response that minimizes power consumption while optimizing performance of the circuit.

A circuit in accordance with the present invention is disclosed in which the most power, and area efficient realizations can be employed for applications requiring broad power supply operating ranges. The circuit employs a simple logic gate system configured to create a self-timed pulsed stimulus for allowing improved performance over a very broad Vdd operation range while simultaneously reducing power.

DETAILED DESCRIPTION OF THE INVENTION

The present invention relates to driver circuits, and more particularly to a method and circuit for optimizing power consumption and performance of driver circuits. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A multiplexed memory bit-line circuit in accordance with the present invention utilizes a logic gate system configured to create a self-timed pulse stimulus which allows for improved performance over conventional circuits. For a more particular understanding of the features of the present invention, refer now to the following description and the accompanying figures.

Figure 3:
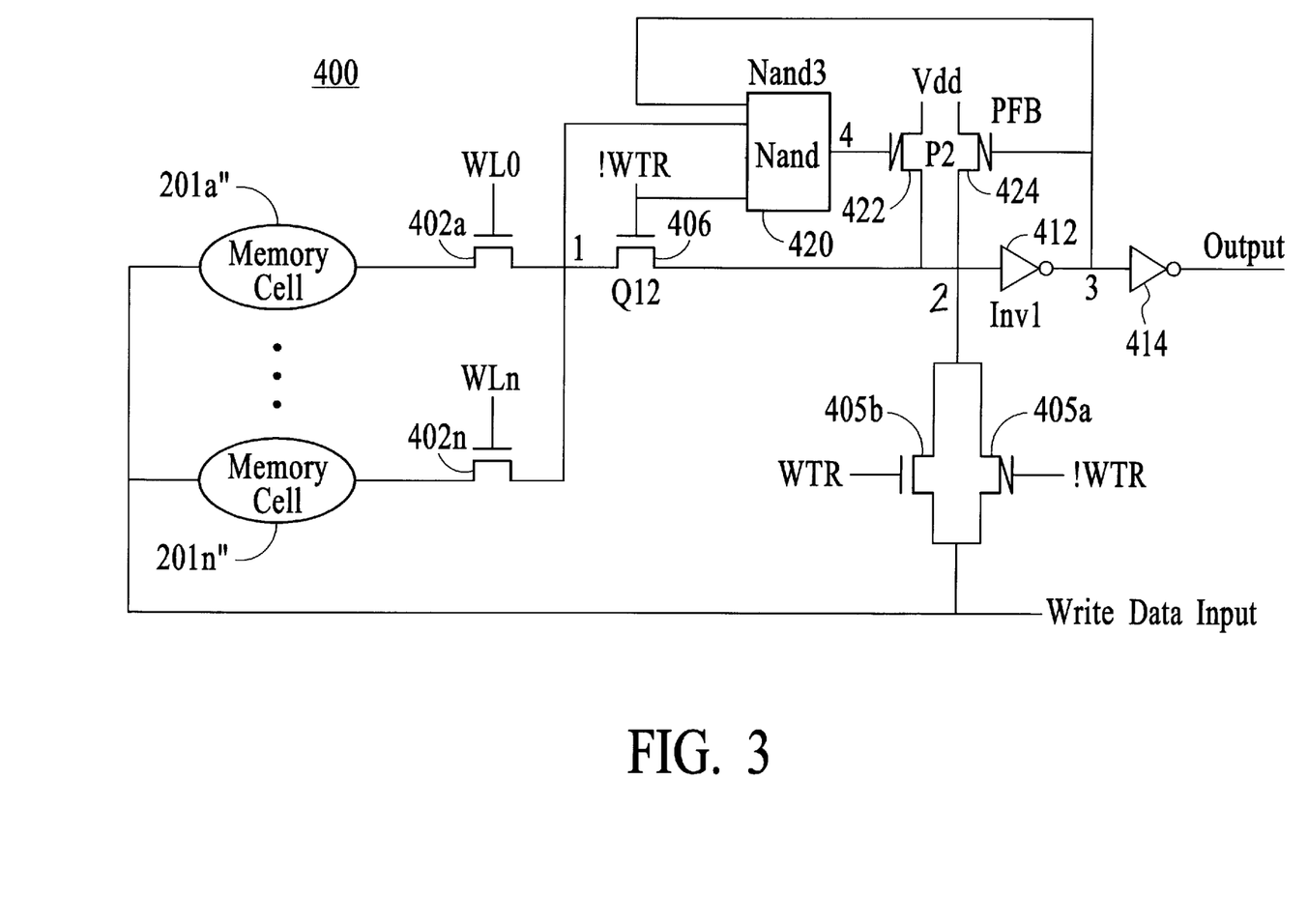
FIG. 3 illustrates a multiplexed memory bit-line circuit in accordance with the present invention.

FIG. 3 illustrates a multiplexed memory bit-line circuit in accordance with the present invention. The circuit 400 shares some of the characteristics of both FIG. 1 and FIG. 2 realizations. From FIG. 1, the nfet device 406*a* is employed for connecting node-1 and node-2. From FIG. 2, an n/p pair transmission gate (pfet device 405*a* and nfet device 405*b*) is associated with the condition for an active WTR.

A key feature of the present invention is the use of a gate, in this embodiment a NAND gate 420, and an additional active device, in this embodiment a pfet device 422. The pfet device 422 in turn is coupled to node-2 and the output of the NAND gate 420. The NAND gate 420 has one of its inputs connected to node-1. A second input of the NAND gate 420 is connected to the !WTR signal and a third input is connected to node-3 or any down stream node with the same phase as node-3. The output of the NAND gate 420 is connected to the gate of pfet device 422, whose source is connected to Vdd and whose drain is connected to node-2.

The circuit 400 operates as follows. For the case of transferring/reading a "1" from the bit-line, the wordline driver signal (Win) activates, thereby transferring the logical "1" content to the bit-line, node-1. For the situation wherein a low Vdd is applied and a boot-strapped word-line circuit is enabled, the node-1 will charge to somewhere between Vdd+Vtp minus Vtn and Vdd.

As stated earlier, due to the body effect of the boosted nfet device pass gate, the bit-line voltage will generally be less than Vdd. Now, as node-1 charges, node-2 begins to follow, but node-2 will not achieve the full voltage of node-1 due to the body effect of the nfet device 406. The gate of NAND gate 420 connected to node-1 however will 'see' the full node-1 voltage and will switch.

Since, the !WTR signal is active ("1") and node-3 is also active ("1"), the NAND gate 420 switches quickly to ground. Since the nfet device 406 is essentially shut off by the time node-2 reaches the lesser of node-1 voltage or Vdd-Vtn, node-1 is isolated from node-2. The pfet device 422, receiving the logical "0" from the NAND gate 420, will begin to readily charge node-2 to Vdd. This forces inverter 412 to switch rapidly, which in turn shuts off the NAND gate 420, thereby disabling the pfet device 422. The duration of the NAND gate 420 output being low and hence the duration of pfet device 422 charging node-2 is a function of the response of node-3.

For increased active duration of these elements, the signal connected to the third input to the NAND gate 420 must be delayed. This can be accomplished by adding another inverter (not shown) after the output inverter 414 and connecting its output to the third input of the NAND gate 420. The duration of the improved response circuit is essentially self-limited. As the response improves, the duration reduces and hence limits any further improvement. Since the accelerated response of node-2 is defined by the duration of the pfet device 422 being active, the feedback device 424 will continue to charge the node completely to Vdd to eliminate the static leakage. Accordingly, the NAND gate 420 and pfet device 422 provide for a "pulsed," self-timed response.

Figure 4:
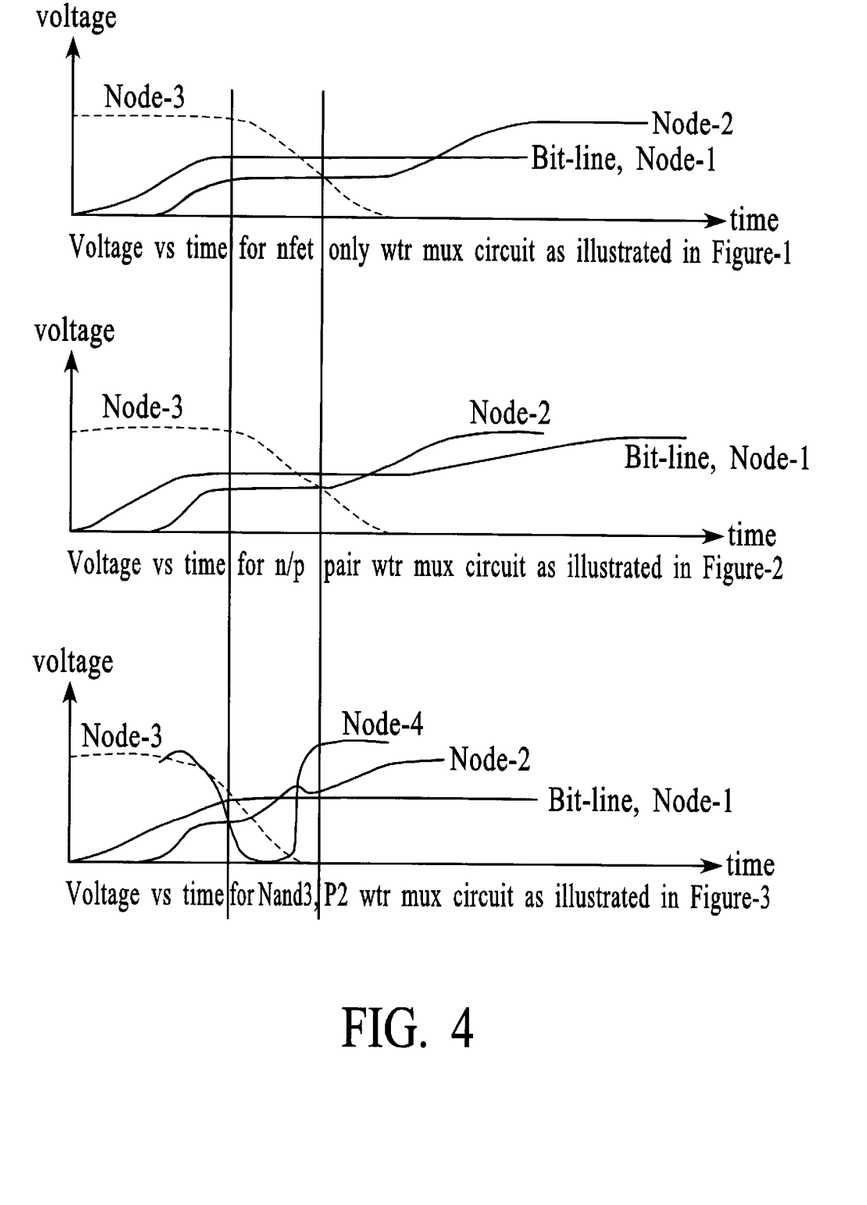
FIG. 4 illustrates the response for the three circuits shown in FIGS. 1, 2 and 3, respectively.

The reason for using a pulsed, self-timed configuration of the NAND gate 420 and pfet device 422 is that when the bit-lines need to be discharged the supplied current of pfet device needs to be held off. The pfet device 422 being held off after it completes its task, allows the falling response to be the same as in the original configuration of FIG. 1. This allows a designer to 'size' the pfet device 422 for the best power/performance associated with the rising output transition without worry of adversely affecting the falling performance. Compared to the n/p pair configuration illustrated in FIG. 2, the circuit 400 demonstrates improved falling response and reduced power, as the bit-lines are not charged to Vdd. FIG. 4 illustrates the response for the three circuits 200, 300 and 400 shown in FIGS. 1, 2 and 3, respectively. As is seen, the output of the circuit (node-3) has a significantly faster response in the circuit 400 of the present invention.

This rapid charging of node-2 greatly improves the response time of the output and also reduces the short-circuit current of inverter 412. In fact, compared with an n/p pair configuration of FIG. 2 in a 130 nm CMOS realization being supplied with a Vdd of 0.7 volts at −55C, this configuration improves the total response time of the entire memory by 25% and reduced the power by 5%!

Another advantage of this configuration is that the bit line is only charged to Vdd-Vt which reduces overall bit power and improves the falling response. Even when the Vdd is at 1.4 volts and t=125C this configuration improves the output response of the entire memory by approximately 9% and reduces power 9%!

Figure 4A:
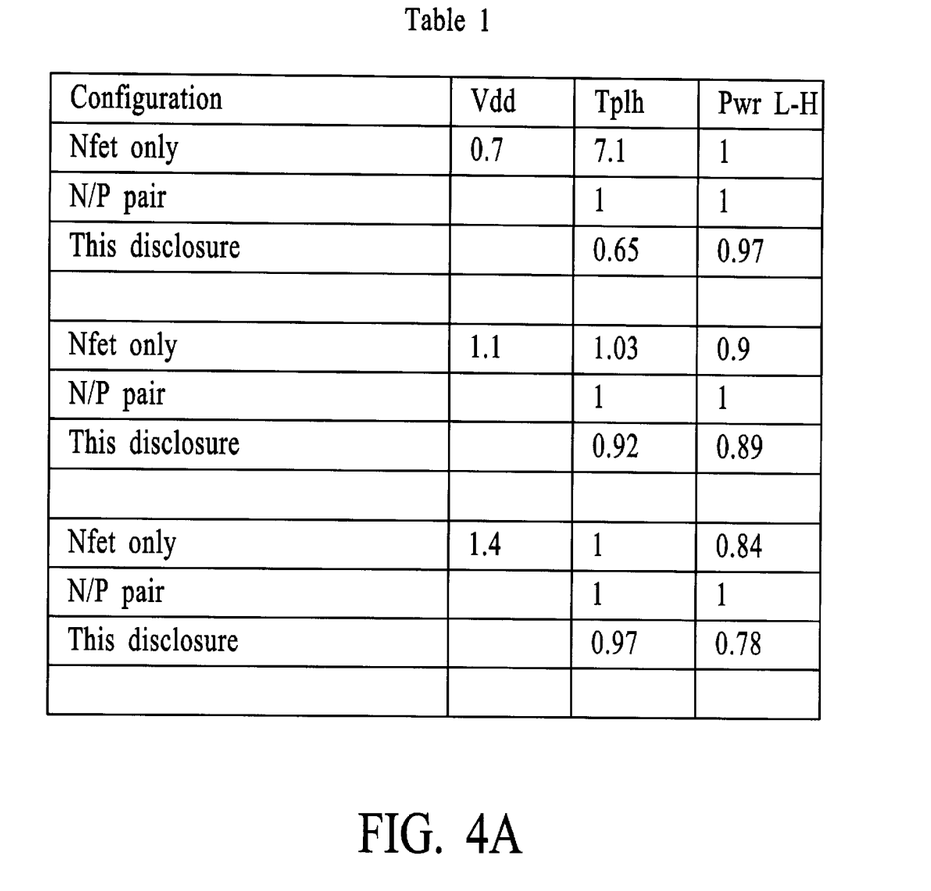
FIG. 4A illustrates the actual power/performance improvements associated with the circuit of FIG. 3.

FIG. 4A illustrates the actual power/performance improvements associated with the circuit 400 of FIG. 3. In FIG. 4A, Vdd is the supply voltage; Tplh is the rising output response relative to the rising word line. The rising response is the dominant performance limiter. Power L-H is the normalized power from a low voltage to high voltage. All content has been normalized to the n/p pair configuration. Note, in reviewing this table, that while having a 3% lower power, the delay of this new inventive circuit configuration relative to the n/p realization is 35% less at 0.7 volts. At 1.4 volts, this configuration has a 3% delay improvement along with a 6% power reduction.

Figure 5:
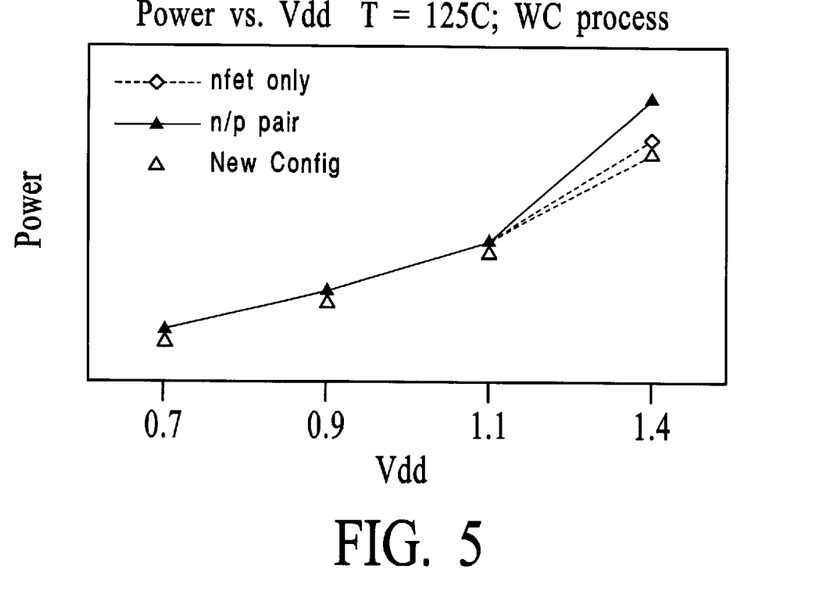
FIG. 5 illustrates power versus Vdd at Tj=125C.
Figure 6:
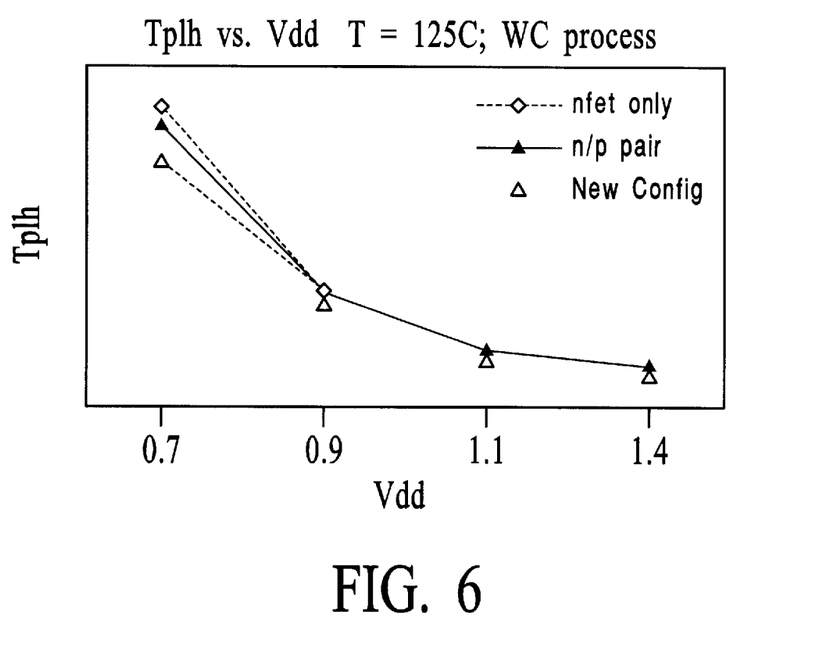
FIG. 6 illustrates Tplh performance versus Vdd at Tj=125C.
Figure 7:
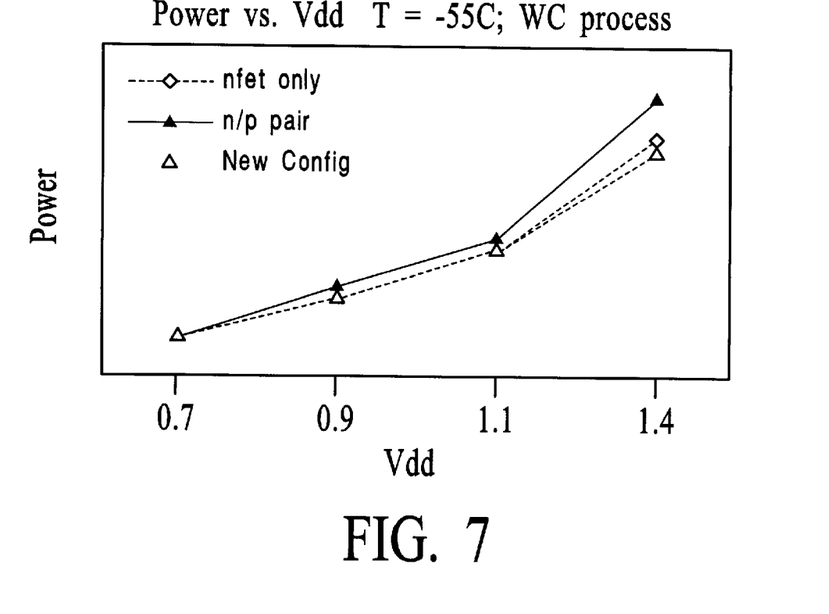
FIG. 7 illustrates power versus Vdd at Tj=–55C.
Figure 8:
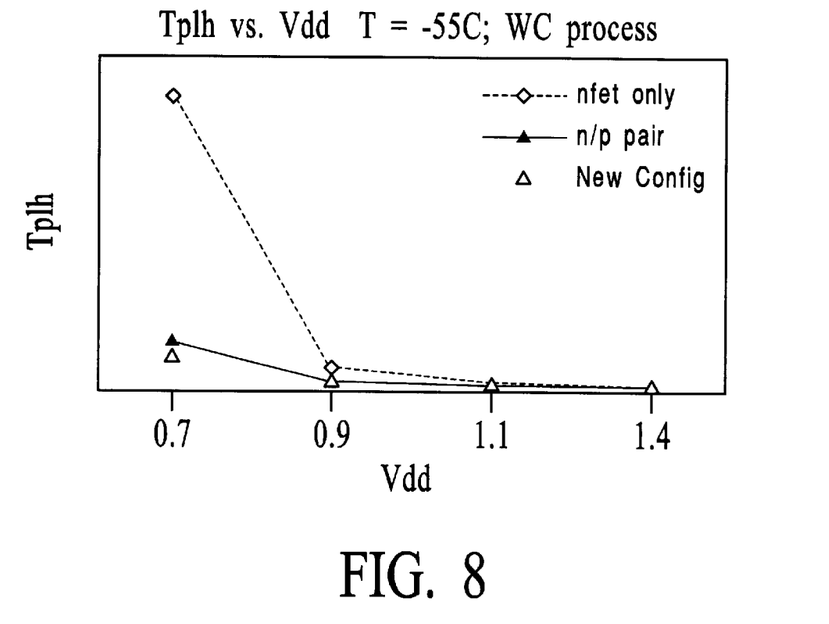
FIG. 8 illustrates performance versus Vdd at Tj=–55C.

FIGS. 5 through 8 graphically illustrate the power and performance improvements at various temperatures. FIG. 5 illustrates power versus Vdd at Tj=125C. FIG. 6 illustrates Tplh performance versus Vdd at Tj=125C. FIG. 7 illustrates power versus Vdd at Tj=−55C. FIG. 8 illustrates performance versus Vdd at Tj=−55C. Note that throughout the temperature range (−55 C. to 125 C.), the circuit 400 in always represents improvements over the prior art.

Hence, a technique has been described wherein the most power and area efficient realizations can be employed for applications requiring broad power supply operating ranges. The technique employs a simple logic gate system configured to create a self-timed pulsed stimulus allowing improved performance over a very broad Vdd operation range while simultaneously reducing power.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A memory bit line multiplexor circuit comprising:

at least one memory cell arrangement;

a first active device coupled to the at least one memory cell arrangement for coupling a first node to a second node within the circuit; the first active device being controlled by a write through read (!wtr) signal;

a second active device coupled to the second node; and a gate; the gate having a first input coupled to the first node; a second input coupled to the !WTR signal, and a third input being controlled by an inversion of the output of the circuit; wherein the gate and the second active device provide a pulsed self-timed response that minimizes power consumption while optimizing performance of the circuit.

2. The memory bit line multiplexor circuit of claim 1 wherein the first active device comprises a nfet device and the second active device comprises a pfet device.

3. The memory bit line multiplexor circuit of claim 1 wherein the gate comprises a 3-input NAND gate.

4. The memory bit line multiplexor circuit of claim 1 wherein the at least one memory cell arrangement comprises a plurality of memory cell arrangements.

5. The memory bit line multiplexor circuit of claim 4 wherein each of the memory cell arrangements comprise;

a memory cell; and a third active device coupled to memory cell for receiving a word line driver (WLn) signal, the WLn signal for transferring the content from the memory cell to the first node.

6. The memory bit line multiplexor circuit of claim 5 that includes a n/p pair transmission gate coupled to the second node.

7. The memory bit line multiplexor circuit of claim 6 that includes a feedback active device coupled between the inversion of the output of the circuit and the second node.

8. The memory bit line multiplexor circuit of claim 1 which includes an inverter system coupled to the output.

9. The memory bit line multiplexor circuit of claim 8 wherein the inverter system includes:

a first inverter, an input of the first inverter coupled to the second node; and a second inverter, an input of second inverter coupled to an output of the first inverter; and for providing the output of the circuit.

10. A memory bit line multiplexor circuit comprising:

at least one memory cell arrangement;

a first active device coupled to the at least one memory cell arrangement for coupling a first node to a second node within the circuit; the first active device being controlled by a write through read (!wtr) signal;

a second active device coupled to the second node;

a gate; the gate having a first input coupled to the first node; a second input coupled to the !WTR signal, and a third input for controlling an output of the circuit; wherein the gate and the second active device provide a pulsed self-timed response that minimizes power consumption while optimizing performance of the circuit;

a n/p pair transmission gate coupled to the second node; and a feedback active device coupled between the inversion of the output of the circuit and the second node.

11. The memory bit line multiplexor circuit of claim 10 wherein each of the memory cell arrangements comprise;

a memory cell; and a third active device coupled to memory cell for receiving a word line driver (WLn) signal, the WLn signal for transferring the content from the memory cell to the first node.

12. The memory bit line multiplexor circuit of claim 10 wherein the inverter system includes:

a first inverter, an input of the first inverter coupled to the second node; and a second inverter, an input of second inverter coupled to an output of the first inverter; and for providing the output of the circuit.

13. The memory bit line multiplexor circuit of claim 10 wherein the first active device comprises a nfet device and the second active device comprises a pfet device.

14. The memory bit line multiplexor circuit of claim 1 wherein the gate comprises a 3-input NAND gate.

* * * * *